(12) United States Patent
Nastasi et al.

(10) Patent No.: US 7,638,410 B2
(45) Date of Patent: Dec. 29, 2009

(54) METHOD OF TRANSFERRING STRAINED SEMICONDUCTOR STRUCTURE

(75) Inventors: Michael A. Nastasi, Santa Fe, NM (US); Lin Shao, College Station, TX (US)

(73) Assignee: Los Alamos National Security, LLC, Los Alamos, NM (US)

( * ) Notice: Subject to any disclaimer, the term of this patent is extended or adjusted under 35 U.S.C. 154(b) by 216 days.

(21) Appl. No.: 11/641,471

(22) Filed: Dec. 18, 2006

(65) Prior Publication Data

US 2007/0173037 A1   Jul. 26, 2007

Related U.S. Application Data

(63) Continuation-in-part of application No. 11/243,010, filed on Oct. 3, 2005, now Pat. No. 7,153,761.

(51) Int. Cl.
*H01L 21/46* (2006.01)

(52) U.S. Cl. .................. 438/455; 438/457; 438/406; 438/E21.211

(58) Field of Classification Search .......... 438/455–459
See application file for complete search history.

(56) References Cited

U.S. PATENT DOCUMENTS

| 4,846,931 | A  | 7/1989  | Gmitter et al. |
| 5,374,564 | A  | 12/1994 | Bruel |
| 5,877,070 | A  | 3/1999  | Goesele et al. |
| 6,352,909 | B1 | 3/2002  | Usenko |
| 6,573,126 | B2 | 6/2003  | Cheng et al. |
| 6,603,156 | B2 | 8/2003  | Rim |
| 6,713,326 | B2 | 3/2004  | Cheng et al. |
| 6,790,747 | B2 | 9/2004  | Henley et al. |
| 6,806,171 | B1 | 10/2004 | Ulyashin et al. |
| 6,911,379 | B2 | 6/2005  | Yeo et al. |
| 6,992,025 | B2 | 1/2006  | Maa et al. |
| 7,109,516 | B2 | 9/2006  | Langdo et al. |
| 2005/0070071 | A1 | 3/2005 | Henley et al. |

OTHER PUBLICATIONS

Yonehara et al., "Epitaxial Layer Transfer by Bond and Etch Back of Porous Si," Appl. Phys. Lett. 64 (16), Apr. 1994.
Ishizaka et al., "Low Temperature Surface Cleaning of Silicon and Its Application to Silicon MBE," J. Electrochem. Soc., Apr. 1986, vol. 133 (4), pp. 666-671.

*Primary Examiner*—Dung A. Le
(74) *Attorney, Agent, or Firm*—Samuel L. Borkowsky

(57) ABSTRACT

The transfer of strained semiconductor layers from one substrate to another substrate involves depositing a multilayer structure on a substrate having surface contaminants. An interface that includes the contaminants is formed in between the deposited layer and the substrate. Hydrogen atoms are introduced into the structure and allowed to diffuse to the interface. Afterward, the deposited multilayer structure is bonded to a second substrate and is separated away at the interface, which results in transferring a multilayer structure from one substrate to the other substrate. The multilayer structure includes at least one strained semiconductor layer and at least one strain-induced seed layer. The strain-induced seed layer can be optionally etched away after the layer transfer.

20 Claims, 3 Drawing Sheets

US 7,638,410 B2

METHOD OF TRANSFERRING STRAINED SEMICONDUCTOR STRUCTURE

RELATED APPLICATIONS

This application is a continuation-in-part of U.S. patent application Ser. No. 11/243,010 filed on Oct. 3, 2005 now U.S. Pat. No. 7,153,761 entitled "Method of Transferring a Thin, Crystalline Semiconductor Layer,".

STATEMENT REGARDING FEDERAL RIGHTS

This invention was made with government support under Contract No. DE-AC51-06NA25396 awarded by the U.S. Department of Energy. The government has certain rights in the invention.

FIELD OF THE INVENTION

The present invention relates generally to semiconductor-on-insulator (SOI) wafers and more particularly to a method for transferring strained layers of monocrystalline semiconductor from one substrate to another.

BACKGROUND OF THE INVENTION

Device performance of transistors can be significantly enhanced if devices are built on strained silicon-on-insulator (SSOI) wafers. The enhancements come from enhanced carrier transport in the strained Si, reduced junction capacitances due to a limited silicon volume, and a reduced leakage current due to isolation by the insulating layer. In general, past methods for producing strained silicon-on-insulator (SSOI) wafers have involved (1) epitaxial growth of a strained silicon layer on a strain-induced seed layer; and (2) transfer of the strained layer and the strain-induced seed layer to an insulator substrate. This transfer step involves implantation of hydrogen ions to a depth beyond the strained layer, bonding the surface of the strained layer to an insulator surface; annealing the bonded structure to generate hydrogen-induced cracks at a depth which is close to the projected range of hydrogen ions; and separation of the structure along the region of microcracks. An example of this transfer method can be found in U.S. Pat. No. 6,992,025 to Maa et al. entitled "Strained Silicon on Insulator from Film Transfer and Relaxation by Hydrogen Implantation". According to the '025 patent, a SiGe layer is deposited on the silicon substrate. The SiGe layer is relaxed by implanting relaxing ions through the SiGe layer into the Si substrate. After polishing, a thin Si layer is deposited onto the SiGe layer. There is a difference in lattice constants between the Si and the SiGe layers. The SiGe layer is used as a strain-induced seed layer to generate strains in the Si layer. Afterward, the Si/SiGe multilayer film is transferred by implantation of ions to a region below the Si/SiGe interface. This method requires that strained Si layer to be directly bombarded by the splitting ions, which results in a strain relaxation in the strained layer. Also the ion bombardments can significantly degrade the crystalline quality.

Another method for preparing an SSOI wafer is described in U.S. Pat. No. 6,603,156 to Rim, entitled "Strained Silicon on Insulator Structures". According to the '156 patent, a multilayer structure of strained-Si/SiGe/Si is bonded to a substrate so that an insulating layer directly contacts the strained Si layer. Afterward, the SiGe layer is removed. The SiGe layer is removed by a selective chemical etching that preferentially etches the SiGe substrates. This method, however, is unsuitable for the preparation of large SSOI wafers requiring ultrathin and smooth strained Si layers.

Another method to preparing an SSOI wafer is described in U.S. Pat. No. 6,911,379 to Yeo et al. entitled "Method of Forming Strained Silicon on Insulator Substrate". According to the '379 patent, the layer transfer of a strained layer to an insulator layer is realized by hydrogen ion implantation, wafer bonding and annealing. Before bonding, the insulating layer is deposited with a high stress film. The high stress film can help retain the strain of the transferred strained layer. This method, however, has disadvantages of strain relaxation and radiation damage caused by hydrogen ion implantation.

In general, for the above methods, splitting is realized by a traditional ion-implantation-based ion-cutting technique. This technique is described in U.S. Pat. No. 5,374,564 to Bruel, entitled "Process for the Production of Thin Semiconductor Material Films". According to the '564 patent, hydrogen ions are implanted into a semiconductor substrate to induce cracking at a depth close to the projected range of H ions. The networking of microcracks finally results in the cleavage of the top semiconductor layer. This method has disadvantages of the requirement of a high fluence of hydrogen (above $5 \times 10^{16}$ cm$^{-2}$), the difficulty in transferring an ultra thin (<0.1 micron) layer, and the low crystalline quality of the transferred layer due to surface damage induced by the hydrogen ion implantation. When this method is used for a layer transfer of a stained Si layer, the implantation-induced strain relaxation represents another major issue.

In view of the drawbacks mentioned above with prior art methods of manufacturing SSOI wafers, there is a need to develop a new method in which a smooth cleavage can be realized without degrading the quality of the strained Si layer. Also the new method should be low cost. For example, the steps required for surface polishing and cleaning need to be minimized.

SUMMARY OF THE INVENTION

In accordance with the purposes of the present invention, as embodied and broadly described herein, the present invention is concerned with a method for transferring a multilayer from one substrate to another substrate. The method involves forming a deposited multilayer structure by depositing an epitaxial multilayer structure on a contaminated first surface of a first substrate, whereby a substantially non-porous interface including surface contaminants from the first surface is formed between the first substrate and the deposited multilayer; contacting the deposited multilayer structure with hydrogen atoms and allowing the hydrogen atoms to diffuse to the interface; forming an intermediate structure by bonding the deposited multilayer structure to a second substrate; and separating the intermediate structure at the substantially non-porous interface, thereby transferring the deposited multilayer from the first substrate to the second substrate.

The invention is also concerned with a method for transferring a multilayer from one substrate to another substrate. The method involves depositing an epitaxial multilayer structure on a contaminated first surface of a first substrate, whereby a substantially non-porous interface including surface contaminants from the substrate is formed between the first substrate and the deposited multilayer; contacting the deposited multilayer structure with hydrogen atoms and allowing the hydrogen atoms to diffuse to the interface; bonding the deposited multilayer structure to a second substrate to form an intermediate structure; separating the intermediate structure at the interface, thereby transferring the deposited multilayer from the first substrate to the second substrate;

etching a portion of the deposited multilayer structure; and thereafter surface polishing the etched multilayer structure.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 1a shows the introduction of hydrogen into a structure having a multilayer structure on a much thicker bottom substrate. FIG. 1b shows the bonding of the multilayer structure to a second substrate. FIG. 1c shows the transferring of the multilayer structure to the second substrate.

DETAILED DESCRIPTION

Briefly, the present invention is concerned with transferring a multilayer structure of crystalline semiconductor from a first substrate to a second substrate. The multilayer structure contains stained layer(s) and strain induced seed layer(s). After the multilayer structure is deposited on the surface of a semiconductor substrate to form a structure, hydrogen (and/or deuterium) atoms are introduced into the structure and allowed to diffuse into the interface between the deposited structure and the first substrate. Afterward, the surface of the deposited structure is bonded to a second substrate to form an intermediate structure. A direct wafer bonding or anodic bonding approach, or some other approach or approaches may be used to form a strong bond between the epitaxial layer and the second substrate. After the bonding, the deposited multilayer structure is separated by splitting at the interface between the deposited multilayer structure and the first substrate. The net result of the separation is the transfer of the multilayer structure from the first substrate to the second substrate.

Reference will now be made in detail to some embodiments of the invention. Similar or identical structures are identified using identical callouts. A schematic representation of an embodiment method of the invention is illustrated in FIGS. 1a, 1b, and 1c.

Figure 1A:
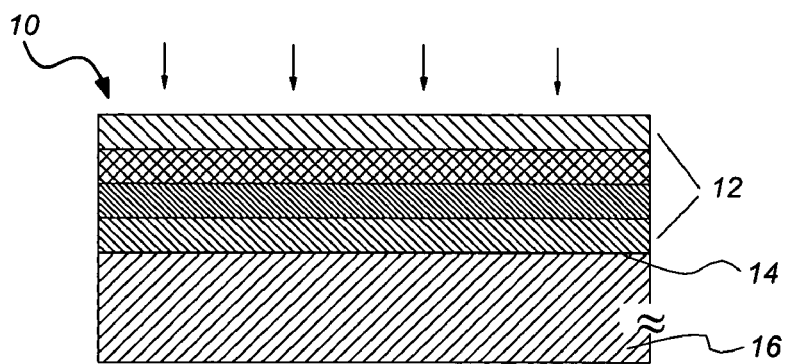
FIG. 1a-c show schematic representations that illustrate the method of the invention.
Figure 1B:
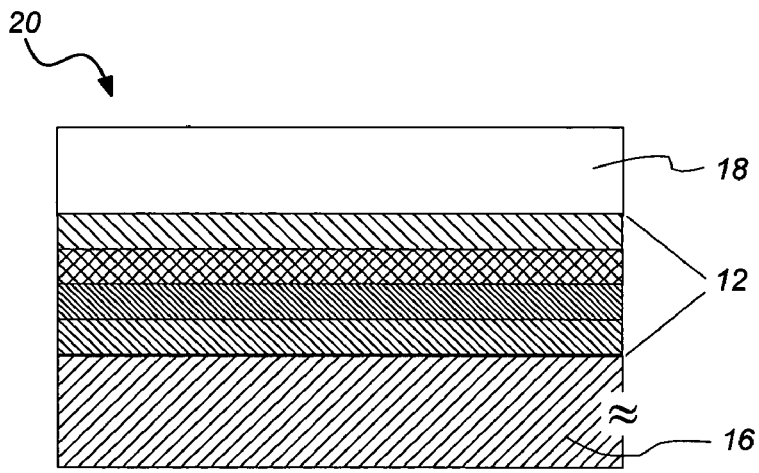
Figure 1C:
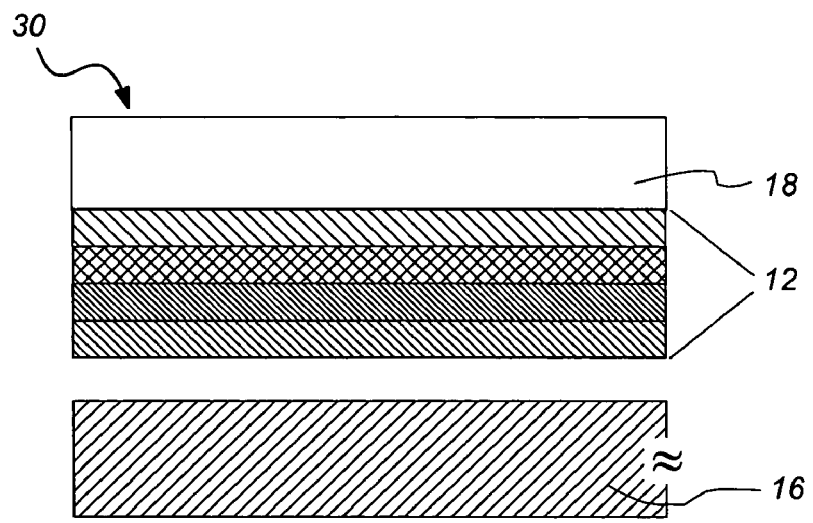

FIG. 1a shows structure 10, which includes multilayer structure 12, substrate layer 16, and interface 14 in between multilayer 12 and substrate layer 16. Interface 14, also referred to herein as a controlled contamination layer, may be a plurality of domains of contaminants in between multilayer 12 and substrate layer 16. The contaminants, which are impurities other than the substrate materials, form a barrier that prevents some of the atoms of substrate layer 16 from forming chemical bonds with atoms of the layer deposited on its top. Interface 14, which prevents a complete bonding between multilayer 10 and layer 16, is exploited as a means for trapping hydrogen atoms before multilayer 12 is separated from structure 10. Contaminants are introduced in a controlled manner such that they do not prevent the growth of the epitaxial multilayer 12, and they also do not induce significant defects that degrade the crystalline quality of deposited multilayer 12. Interface 14 may be a plurality of islands of contaminants, or a sub-monolayer, with a thickness in a range of from less than 1 nanometer to a few nanometers, or from a few nanometers to a few tens of nanometers.

Interface 14 may be introduced by ex situ processes such as chemical dipping or chemical mechanical polishing or by in situ processes such as exposing the substrate to impurity vapors prior to the deposition of epitaxial multilayer 12.

The contaminants can be organic, inorganic, or combinations of organic and inorganic contaminants, and include, but are not limited to, oxygen contaminants, hydrogen contaminants, fluorine contaminants, carbon contaminants, contaminants of one or more metals, or mixtures or compounds of these contaminants. In an embodiment, multilayer layer 12 is $Si/Si_{1-x}Ge_x/Si$ and the layer 16 is Si, and the controlled contaminant layer is islands or a sub-monolayer of silicon oxide. In another embodiment, the controlled contaminant layer is islands or a sub-monolayer of a hydrocarbon layer.

The contaminants may be found in various cleaning solutions. In an embodiment, controlled contamination is introduced through a surface-cleaning process that is performed before the growth of epitaxial multilayer 12. The cleaning process may involve wet-chemical cleaning, dry cleaning, ultraviolet-ozone cleaning, vapor phase wafer cleaning, plasma cleaning, or a combination of above processes. In an embodiment, the cleaning involves dipping the first substrate into diluted hydrofluoric acid (HF). In another embodiment, the first substrate experiences a cleaning process described by Ishizaki et al. in "Low Temperature Surface Cleaning of Silicon and its Application to Silicon MBE", Journal of the Electrochemical Society, vol. 133, pp. 666-671, April 1986, incorporated by reference. This process, which is sometimes known in the art as a "Shiraki" cleaning process, includes the steps of (1) dipping the substrate into a solution of HF followed by rinsing with water; thereafter (2) dipping the substrate into a solution of boiling nitric acid ($HNO_3$) followed by rinsing in water; thereafter (3) dipping the substrate into a dilute solution of HF followed by rinsing in water; thereafter (4) dipping the substrate into a boiling 1:1:3 $NH_4OH:H_2O_2:H_2O$ solution followed by rinsing with water; thereafter (5) dipping the substrate into a dilute solution of HF followed by rinsing with water; and thereafter (6) dipping the substrate into a boiling 3:1:1 $HCl:H_2O_2:H_2O$ solution followed by rinsing with water. In another embodiment, the first substrate experiences a cleaning procedure of a type developed at the Radio Corporation of America (RCA) and described by Kern et al. in "Cleaning Solution Based on Hydrogen Peroxide for Use in Semiconductor Technology", *RCA Review*, June 1970, pp. 187-206, incorporated by reference. This type of procedure, which is sometimes known in the art as an RCA cleaning procedure, has the following three major sequential steps: (1) dipping the substrate into an aqueous solution of ammonium hydroxide and hydrogen peroxide (5:1:1 $H_2O:H_2O_2:NH_4OH$); thereafter (2) dipping the substrate into a dilute aqueous solution of HF (50:1 $H_2O:HF$); and thereafter (3) dipping the substrate into an aqueous solution of hydrogen peroxide and hydrochloric acid (6:1:1 $H_2O:H_2O_2:HCl$). In the aforementioned embodiments, the level of surface contamination may be controlled by adjusting the dipping period, or by changing the components of the cleaning solutions.

Multilayer 12 may have a thickness of from about 10 Angstroms to about 100,000 Angstroms. In some embodiments, the thickness is less than 2000 Angstroms. Layer 16 may have a thickness of from about 1 micrometer (μm) to about 1000 μm (1 μm=$10^{-6}$ meters). In some embodiments, the thickness of layer 16 is less than about 600 μm.

Multilayer 12 includes two or more epitaxial layers of semiconductor materials. Furthermore, multilayer 12 includes at least one epitaxial layer that has a lattice constant different from the others layers in multilayer 12. The materials in multilayer 12 include, but are not limited to, group IV materials, group III-V compound materials, group II-VI compound materials, and group III-nitride materials. Group III-V compound materials are materials made from a group III element and a group V element. Group II-VI compound materials are materials made from a group II element and a group VI element. Some group IV materials include Si, Ge, $Si_{1-y}C_y$, $Si_{1-x-y}C_xGe_y$, or $Si_{1-y}Ge_y$, where x and y are in the range of from about 0.010 to about 1. Some group III-V compound materials include, but are not limited to, aluminum phosphide (AlP), aluminum arsenide (AlAs), aluminum antimonide (AlSb), gallium phosphide (GaP), gallium arsenide (GaAs), gallium antimonide (GaSb), indium phosphide (InP), indium arsenide (InAs), and indium antimonide (InSb). Some group II-VI compound materials include, but are not limited to, zinc oxide (ZnO), zinc sulfide (ZnS), zinc selenide (ZnSe), zinc telluride (ZnTe), cadmium sulfide (CdS), cadmium selenide (CdSe), cadmium telluride (CdTe), mercuric sulfide (HgS), mercuric selenide (HgSe), and mercuric telluride (HgTe). Preferred group III-nitride compound materials include, but are not limited to, aluminum nitride (AlN), gallium nitride (GaN), and indium nitride (InN).

The growth of multilayer 12 and layer 16 to form the first structure 10 may be accomplished by any known method for depositing layers of semiconductor materials. These methods include, but are not limited to, thermal chemical vapor deposition (CVD), reduced-pressure chemical vapor deposition, molecular beam epitaxy (MBE), low temperature molecular beam epitaxy, ion beam assisted deposition (IBAD) and sputtering. In some embodiments, multilayer 12 is grown by one of the methods mentioned above and substrate layer 16 (or part of substrate layer 16) is grown by techniques known in the art as "Czochralski Crystal Growth" or "Float Zone Crystal Growth". Usually, substrate layer 16 has a high degree of chemical purity, a high degree of crystalline perfection, and high structure uniformity.

In an embodiment, the growth of multilayer 12 is realized by chemical vapor deposition. Silane ($SiH_4$) source gas, for example, may be used to deposit a monocrystalline silicon layer. Usually, a high growth rate is readily achieved by deposition at high chemical vapor deposition temperatures. The high temperatures may also reduce the incorporation of impurities and improve layer uniformity. Adequate growth rates, i.e., >0.01 Angstrom/s using $SiH_4$ may be attained at a temperature of about 550 degrees Celsius.

After the fabrication of structure 10, hydrogen atoms are introduced into structure 10. Hydrogenation by hydrogen plasma may be used. Hydrogenation of structure 10 can be achieved by forming ionized hydrogen plasma about structure 10 within an enclosing chamber and by applying repetitive high voltage negative pulses to structure 10 to drive the hydrogen ions into exposed surfaces of the structure 10. It should be understood that hydrogenation may involve using normal hydrogen atoms (H), deuterium atoms (D), hydrogen molecules ($H_2$), deuterium molecules ($D_2$), hydrogen deuterium (HD), or mixtures thereof. Hydrogenation is performed with the structure 10 at an elevated temperature for a duration long enough to introduce enough hydrogen into structure 10 and diffuse the hydrogen into the interface 14 where at least some of hydrogen atoms are trapped. Sub-surface microcracks may be formed during this stage. The temperature of structure 10 may be adjusted below the temperature at which significant blistering of the surface of structure 10 occurs. The energy of the hydrogen used for hydrogenation may be in the range of about 50 eV to about 100 keV. In some embodiments, the energy of the hydrogen is below 1 keV, and the hydrogenation temperature is below about 600 degrees Celsius, and the hydrogenation duration is less than 10 hours. In an embodiment, the energy of the hydrogen is 500 eV and the substrate temperature is about 300 degrees Celsius and hydrogenation duration is less than about 3 hours.

FIG. 1b shows a schematic representation of structure 20 produced after bonding the multilayer 12 to the second substrate 18. The second substrate 18 may be a material chosen from silicon, germanium, oxidized silicon, glass, fused quartz, sapphire, gallium nitride, and silicon carbide. An intimate and strong bond between multilayer 12 and substrate 18 may be realized using, for example, direct wafer bonding or anodic bonding.

FIG. 1c shows a schematic representation of the transfer of multilayer 12 onto second substrate 18 to form structure 30. This stage may involve the heat treatment of the structure 20 (FIG. 1b), which results in separation of the multilayer 12 at interface 14. This stage may also involve applying an external force to structure 20 at interface 14. External forces include, but are not limited to, bending structure 10, or using liquid fluid, or using a solid razor blade, or a gas blade to cleave heterostructure at the interface 14. In any case, the separation is controlled to happen at the interface 14.

The heat treatment in the stage of layer transfer is usually at a temperate above about 500 degrees Celsius. It is expected that the threshold temperature for layer transfer may be lower than temperatures usually required by other methods, which would greatly benefit the layer transfer if substrate 18 has a thermal expansion coefficient that is very different from that of the transferred layer (i.e. multilayer 12).

In an embodiment, structure 10 may optionally include an encapsulating layer on multilayer 12. An encapsulating layer offers a protective function by minimizing unwanted contamination of the structure. In an embodiment, the encapsulating layer is a silicon oxide layer with a thickness of from about 10 nm to about 1000 nm. The encapsulating layer may be removed after introduction of hydrogen atoms, for example, gas phase etching or by dipping the structure 10 into a dilute solution of acid (HF, for example). Formation and etching of encapsulating layer later can help to reduce the thickness of multilayer 12 which is to be bonded and transferred. Encapsulating layer can, however, be left in place and be directly bonded to substrate 18.

Figure 2:
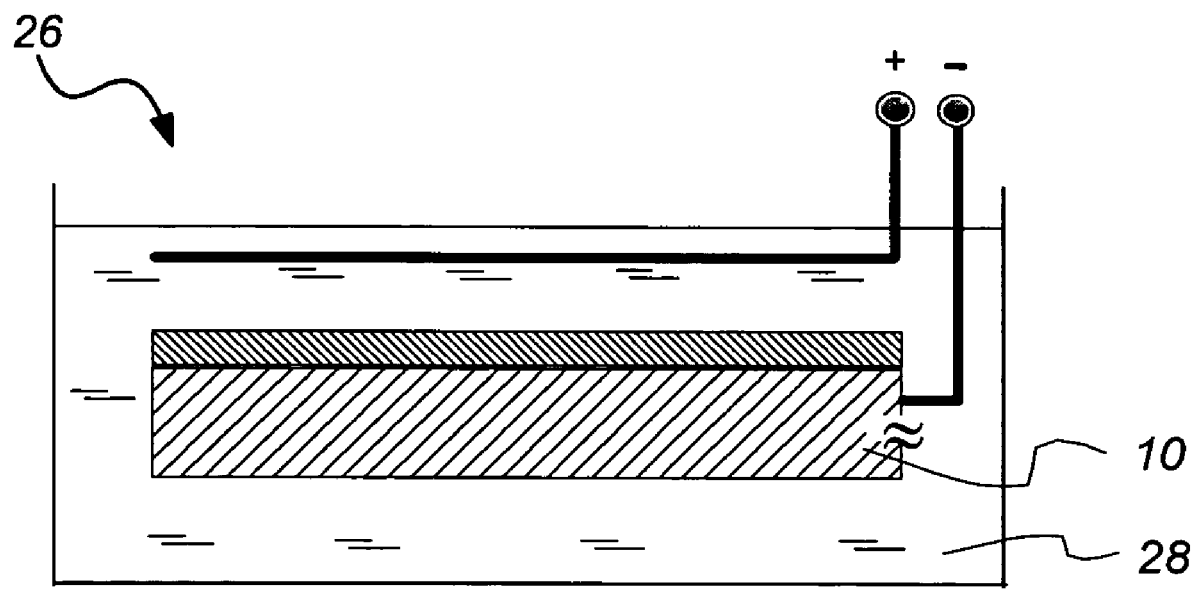
FIG. 2 shows a schematic representation of the introduction of hydrogen into the structure of FIG. 1a-c by an electrolytic process.

In another embodiment, the introduction of hydrogen into structure 10 may be realized electrolytically. FIG. 2 is a schematic representation of an electrolytic set-up 26 for introducing hydrogen into structure 10. As FIG. 2 shows, structure 10 is in electrolytic contact with electrolyte 28. When electrolyte 28 decomposes during the electrolysis, monatomic hydrogen is produced. A suitable electrolyte should be chosen in order to avoid significant damage to the surface of structure 10 by oxidation or etching. Suitable electrolytes include, but are not limited to, acids such as $H_3PO_4$, HF, HCl, $H_2SO_4$, and $H_3COOH$. After the electrolysis, an appropriate surface cleaning may be performed to remove the hydrogen-rich surface.

An EXAMPLE will now be described that relates to the lift-off process to transfer a thin film in a monocrystalline silicon wafer with the aid of plasma hydrogenation. The EXAMPLE is given to illustrate an embodiment of the present invention, and it should be understood that the present invention is not limited to only this embodiment.

EXAMPLE

A 100-nm thick epitaxial Si layer was grown on a <100> 500 Ω-cm p-type Si substrate. After that, a 5 nm thick epitaxial $Si_{0.8}Ge_{0.2}$ layer was deposited. Finally, a 200 nm epitaxial Si layer was deposited on the top of the $Si_{0.8}Ge_{0.2}$ layer. The silicon substrate is first cleaned as follows. The substrate was dipped into an aqueous 4% HF solution, then rinsed with water, then dipped into a solution of boiling nitric acid for about 10 minutes, and afterward rinsed with water. Subsequently, the substrate was dipped into an aqueous 4% solution of HF for about 20 seconds, then rinsed with water, and then dipped into a boiling aqueous solution of ammonium hydroxide and hydrogen peroxide 1:1:3 $NH_4OH:H_2O_2:H_2O$ for about 10 minutes. After rinsing with water, the substrate was dipped into an aqueous 4% solution for about 20 seconds, dried using nitrogen gas, and then immediately loaded into a vacuum system. During the growth, the substrate temperature was maintained at about 550 degrees Celsius.

Figure 3:
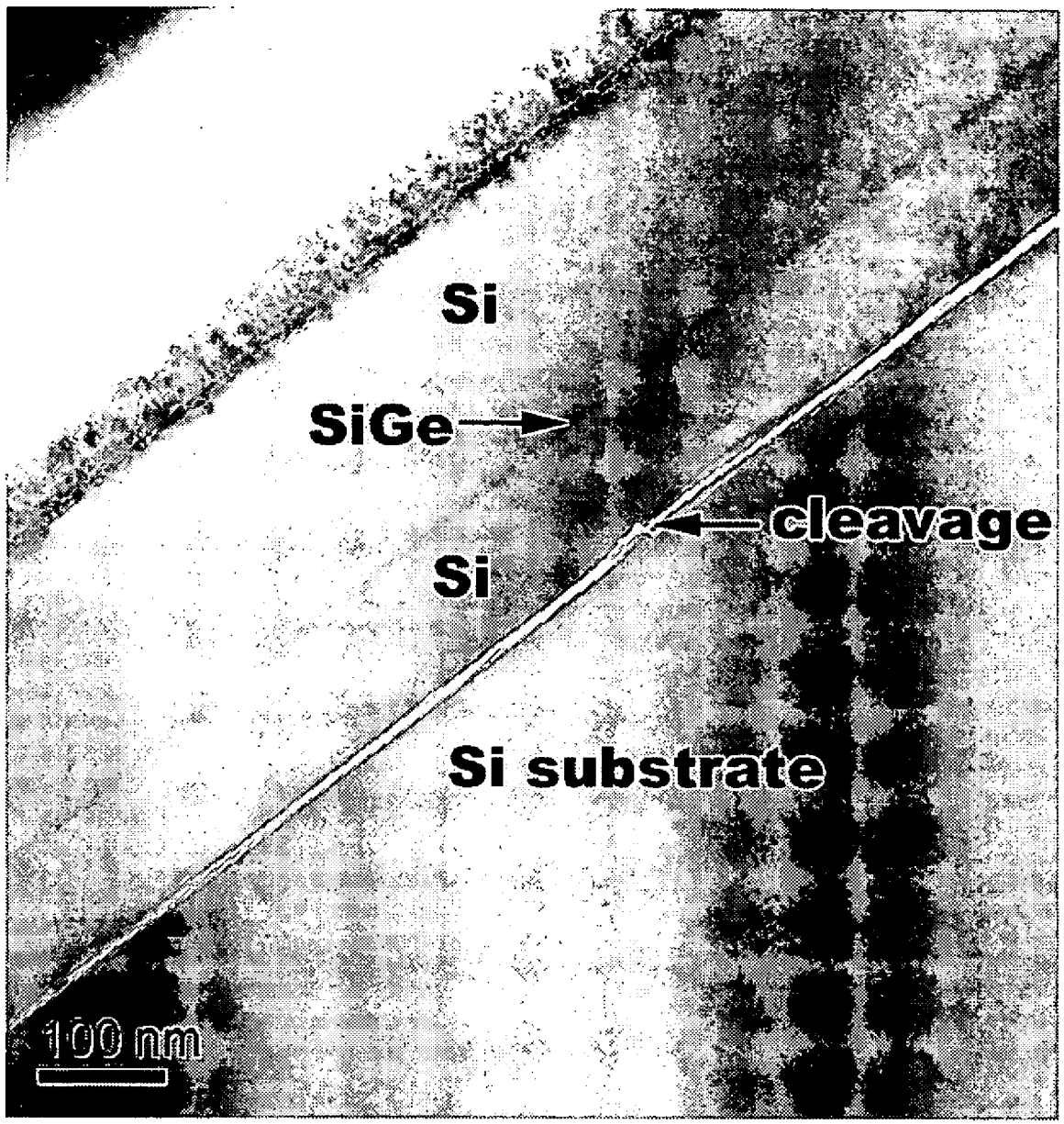
FIG. 3 shows a transmission electron microscopy (TEM) image of a $Si/Si_{0.8}Ge_{0.2}/Si/Si$ multilayer structure after hydrogenation. The sample was prepared by depositing a Si (200-nm thick)/$Si_{0.8}Ge_{0.2}$ (5-nm thick)/Si (100-nm thick) structure on a silicon substrate by using molecular beam epitaxy (MBE).

The structure was subjected to plasma hydrogenation using a reactive hydrogen ion etching system that provided hydrogen plasma with a bias of about −500 V. The structure was exposed to the hydrogen plasma for about 3 hours. During plasma exposure, the sample temperature is estimated to be about 250 degrees Celsius. A TEM image of the structure after hydrogenation is shown in FIG. 3. As the TEM image shows, a continuous cracking which is parallel to the surface has formed at the original interface between the deposited multilayer and the substrate.

The formation of continuous microcracks parallel to the Si surface is critical for the layer transfer for the fabrication of strained silicon-on-insulator wafers. The growth and joining of these microcracks allows the surface layer to become completely separated from the substrate. Thus, the EXAMPLE demonstrates that the blistering location can be controlled, and is at the interface between the deposited thin epitaxial layers and the substrate. Thus, conventional ion implantation steps are not required.

Embodiments of the invention provide several advantages: 1) the ability to control cleavage at the interface; 2) the ability to reduce the surface roughness of the transferred layer as a result of smoother cleavage; 3) the ability to improve the crystalline quality of the transferred layer; and 4) the ability to improve the chemical purity of the transferred layer.

The interfacial cracking occurs only if significant hydrogen atom trapping occurs at the interface. Defects in the deposited layers may limit the hydrogen atom penetration and prevent interfacial hydrogen atom trapping. To realize controllable cracking at the interface, the growth conditions of the deposited epitaxial layers are adjusted in order to provide a high crystalline quality and a low defect density such that sufficient hydrogen atoms diffuse to the interface so that interfacial cracking may occur. The adjustable parameters for high crystalline quality film growth by MBE include, but are not limited to the chamber pressure, substrate temperature, and evaporation rates.

For film growth using chemical vapor deposition (CVD), the adjustable parameters are similar to those for growth using MBE, but also include the deposition chemistry and reaction path of chemical precursors. For film growth using Ion Beam Assisted Deposition (IBAD) (see, for example: Nastasi et al. in Ion-Solid Interactions: Fundamentals and Applications, chapter 13, Cambridge University Press, 1996), additional adjustable parameters include the type, the energy and the flux of the ions bombarding a growing film.

In summary, the present invention relates to transferring multilayers from one substrate to another. The disclosed process permits fabrication of a strained silicon-on-insulator (SOI) wafer. The present invention provides advantages of crystalline quality, chemical purity, surface smoothness, and controllability of the thickness of the transferred layer.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for transferring a multilayer from one substrate to another substrate comprising:
   forming a deposited multilayer structure by depositing an epitaxial multilayer structure on a contaminated first surface of a first substrate, wherein the multilayer structure is deposited by molecular beam epitaxy, chemical vapor deposition, metal-organic vapor phase epitaxy, sputtering, or ion beam assisted deposition, whereby a substantially non-porous interface including surface contaminants from the first surface is formed between the first substrate and the deposited multilayer;
   contacting the deposited multilayer structure with hydrogen atoms and allowing the hydrogen atoms to diffuse to the interface;
   forming an intermediate structure by bonding the deposited multilayer structure to a second substrate; and
   separating the intermediate structure at the substantially non-porous interface, thereby transferring the deposited multilayer from the first substrate to the second substrate.

2. The method of claim 1, wherein the contaminated first surface is produced by exposing the first substrate to a solution comprising at least one chemical chosen from $H_2O$, $H_2O_2$, $H_2SO_4$, HF, $NH_4OH$, HCl, $H_3PO_4$, and $CH_3COOH$.

3. The method of claim 1, further comprising heating the first substrate at an elevated temperature while depositing the multilayer structure on the first substrate to minimize defects in the deposited multilayer structure.

4. The method of claim 1, wherein the step of contacting the deposited multilayer structure with hydrogen comprises plasma hydrogenation.

5. The method of claim 4, further comprising adjusting the temperature of the first substrate and deposited multilayer during plasma hydrogenation such that blistering on the surface is minimized.

6. The method of claim 1, wherein the step of separating the intermediate structure comprises heating the intermediate structure at a temperature high enough to produce cracks at the substantially non-porous interface.

7. The method of claim 1 wherein the step of contacting the deposited multilayer structure with hydrogen comprises electrically connecting the multilayer structure to an electrolytic cell and exposing the multilayer structure to an electrolyte in the electrolytic cell, wherein at least some electrolyte from the electrolytic cell produces hydrogen ions.

8. The method of claim 1, wherein separating the intermediate structure at the interface comprises subjecting the intermediate structure to an externally applied force.

9. The method of claim 1, further comprising providing a first substrate having an islanded layer of contaminants on a surface of the first substrate.

10. The method of claim 1, wherein the deposited multilayer structure is chosen from $Si/Si_{1-x}Ge_x$, $Si_{1-x}Ge_x/Si$, $Si/Si_{1-x}Ge_x/Si$, strained-Si/strain-relaxed $Si_{1-x}Ge_x$/graded $Si_{1-x}Ge_xSi$, where x is in a range of from about 0.010 to about 1.

11. The method of claim 1, wherein the contaminants comprise hydrogen, carbon, oxygen, fluorine, chlorine, sulfur, or combinations thereof.

12. The method of claim 11, wherein the second substrate comprises silicon, oxidized silicon, glass, quartz, sapphire or combinations thereof.

13. The method of claim 12, further comprising forming an encapsulating layer of silicon dioxide on the deposited multilayer structure before the step of contacting the deposited multilayer structure with hydrogen atoms.

14. The method of claim 1, wherein the deposited multilayer structure comprises a group III-V compound material chosen from AlP, AlAs, AlSb, GaP, GaAs, GaSb, InP, InAs, and InSb.

15. The method of claim 1, wherein the deposited multilayer structure comprises a material chosen from ZnO, ZnS, ZnSe, ZnTe, OdS, CdSe, CdTe, HgS, HgSe, and HgTe.

16. The method of claim 1, wherein the deposited multilayer structure comprises a group III nitride compound material chosen from AlN, GaN, and InN.

17. The method of claim 1, wherein the deposited multilayer structure comprises at least one strained layer and at least one strained-induced seed layer, wherein the strained layer and the strain-induced seed layer have different lattice constants.

18. A method for transferring a multilayer from one substrate to another substrate comprising:
depositing an epitaxial multilayer structure on a contaminated first surface of a first substrate, wherein the multilayer structure comprises at least one strained layer and at least one strain-induced layer whereby a substantially non-porous interface including surface contaminants from the substrate is formed between the first substrate and the deposited multilayer;
contacting the deposited multilayer structure with hydrogen atoms and allowing the hydrogen atoms to diffuse to the interface;
bonding the deposited multilayer structure to a second substrate to form an intermediate structure;
separating the intermediate structure at the interface, thereby transferring the deposited multilayer from the first substrate to the second substrate;
etching a portion of the deposited multilayer structure; and thereafter
surface polishing the etched multilayer structure.

19. The method of claim 18, wherein after etching the strain-induced layer is removed and the strained layer that remains is in contact with the second substrate.

20. The method of claim 18, wherein the multilayer structure comprises an etching stop layer and the etching stops at the etching stop layer.

* * * * *